United States Patent
Jinbo

[19]

[11] Patent Number: 5,931,563
[45] Date of Patent: Aug. 3, 1999

[54] METHOD AND DEVICE FOR ERASING NON-VOLATILE SEMICONDUCTOR MEMORY WITH SMALLER ERASE VARIATION

[75] Inventor: Toshikatsu Jinbo, Tokyo, Japan

[73] Assignee: NEC Corporation, Tokyo, Japan

[21] Appl. No.: 08/988,087

[22] Filed: Dec. 10, 1997

[30] Foreign Application Priority Data

Dec. 10, 1996 [JP] Japan .................................. 8-329961

[51] Int. Cl.⁶ .................................................. G11C 16/04
[52] U.S. Cl. .............................. 362/185.29; 365/185.18; 365/185.19
[58] Field of Search ....................... 365/185.29, 185.18, 365/185.19

[56] References Cited

U.S. PATENT DOCUMENTS

| 4,875,188 | 10/1989 | Jungroth | 365/185.22 |
|---|---|---|---|
| 5,077,691 | 12/1991 | Haddad et al. | 365/185.23 |
| 5,295,107 | 3/1994 | Okazawa et al. | 365/218 |
| 5,309,402 | 5/1994 | Okazawa | 365/218 |
| 5,485,423 | 1/1996 | Tang et al. | 365/185.19 |
| 5,581,502 | 12/1996 | Richart et al. | 365/185.26 |

*Primary Examiner*—David Nelms
*Assistant Examiner*—Hoai V. Ho
*Attorney, Agent, or Firm*—Whitham, Curtis & Whitham

[57] ABSTRACT

An entire erasing period for a non-volatile semiconductor memory is divided into a first erasing mode and a second erasing mode. In the first erasing mode, a positive voltage is applied to sources of memory cells MC00 through MCmn with gates of the memory cells at a ground potential to carry out the erasing operation until an erasing voltage VTM2 that is higher than a final erasing voltage VTM1 is obtained. In the second erasing mode, negative and positive voltages are applied to the gates and the sources, respectively, of the memory cells to carry out the erasing operation until the final erasing voltage VTM1 is obtained.

24 Claims, 7 Drawing Sheets

METHOD AND DEVICE FOR ERASING NON-VOLATILE SEMICONDUCTOR MEMORY WITH SMALLER ERASE VARIATION

BACKGROUND OF THE INVENTION

The present invention relates to a method and a device for erasing a non-volatile semiconductor memory. The erasing method and device of the present invention is particularly suitable for a semiconductor memory such as a flash EEPROM that carries out write-in operation by using hot electron injection and is erased by FN (Fowler-Nordheim) tunneling.

Electrically erasable and programmable read-only memories (EEPROMs) are well known as an example of the non-volatile semiconductor memory. In the non-volatile semiconductor memories of the type described, a plurality of memory cells form a memory cell array. Each memory cell has a floating gate that is electrically insulated between a control gate of an MOS transistor and a silicon substrate.

Electrons trapped in the floating gates in a non-volatile semiconductor memory can be discharged by applying a zero voltage or a negative voltage and a positive voltage (e.g., +12 V) for electron discharge to the control gate and a source, respectively, with a drain of the memory cell being in a floating state. A high electrical field is generated from the source of the memory cell toward the floating gate, providing an FN (Fowler-Nordheim) current from the source of the memory cell to the floating gate. As is well known in the art, electrons travel in the opposite direction to electrical current does. Thus the electrons are discharged from the floating gate. The positive voltage is generally supplied through a source voltage control circuit for the electron discharge applied to the source of the memory cell for the electron discharge operation.

Examples of memory erase operation for such non-volatile semiconductor memories are disclosed in, for example, U.S. Pat. No. 5,077,691 (hereinafter, referred to as a first conventional example) and U.S. Pat. No. 5,485,423 (hereinafter, referred to as a second conventional example). Briefly, the first conventional example opens drains (column lines) of memory cells during erase operation. A positive voltage (e.g., +5 V) and a negative voltage (e.g., -12 V) are applied to sources and gates, respectively, of the memory cells to erase data. The second conventional example opens drains of memory cells during erase operation. A constant positive voltage (e.g., +5 V) is applied to sources of the memory cells. Simultaneously, a negative step-shaped voltage that is gradually decreased is applied to gates of the memory cells.

The floating gate in the first conventional example has a high negative potential at the beginning of the erasing operation. A tunneling film between the floating gate and the silicone substrate has a high electrical field. This deteriorates the tunneling film and in turn deteriorates lifetime characteristics of the memory cells.

The second conventional example has the effect of reducing the electrical field across a tunnel film. However, this second conventional example has the following drawbacks. The negative step-shaped voltage that is gradually decreased is controlled according to a time during which it is applied to, without detecting the voltage actually applied across the gate. The effect of the reduction of the electrical field thus depends on an erase rate, which is not considered to be sufficient. In addition, the problem of the erase variation is not solved as in the first conventional example.

SUMMARY OF THE INVENTION

Therefore, an object of the present invention is to provide a method for erasing a non-volatile semiconductor memory that is capable of avoiding deterioration of lifetime characteristics by means of reducing an electrical field between a source and a floating gate, with the optimum supply of a voltage to the source and the gate during the erasing operation.

Another object of the present invention is to provide a method for erasing a non-volatile semiconductor memory that is effective for reducing erasing time duration.

It is yet another object of the present invention to provide a device for erasing a non-volatile semiconductor memory that is suitable for the above-mentioned erasing method.

The present invention is applied to a non-volatile semiconductor memory having a plurality of memory cells. According to an aspect of the present invention, an entire erasing period for the non-volatile semiconductor memory is divided into a first erasing mode and a second erasing mode. In the first erasing mode, a positive voltage is applied to sources of the memory cells with gates of the memory cells each having a ground potential to carry out the erasing operation. In the second erasing mode, negative and positive voltages are applied to the gates and the sources, respectively, of the memory cells to carry out the erasing operation.

An erasing device according to the present invention is applied to a semiconductor memory having a plurality of memory cells. The erasing device comprises a negative voltage supply circuit for applying a negative voltage to gates of the memory cells via a row decoder in response to an erasing gate control signal, a source voltage supply circuit for applying a positive voltage to the sources of the memory cells via a common source line in response to an erasing source control signal, a positive voltage supply circuit for applying a positive voltage for verification to the gates of the memory cells via the row decoder, and a control device adapted to generate the erasing gate control signal, the erasing source control signal, and a signal for the verify control at a predetermined timing. The control device divides the entire erasing period into a first erasing mode and a second erasing mode. The control device generates, in the first erasing mode, the erasing gate control signal to force the gates of the memory cells to have the ground potential and the erasing source control signal to apply the positive voltage to the source of the memory cells to carry out the control for the erasing operation. The control device then generates, in the second erasing mode, the erasing gate control signal to apply the negative voltage to the gates of the memory cells and the erasing source control signal to apply the positive voltage to the sources of the cells to carry out the control for the erasing operation.

DESCRIPTION OF THE PREFERRED EMBODIMENTS

Figure 1:
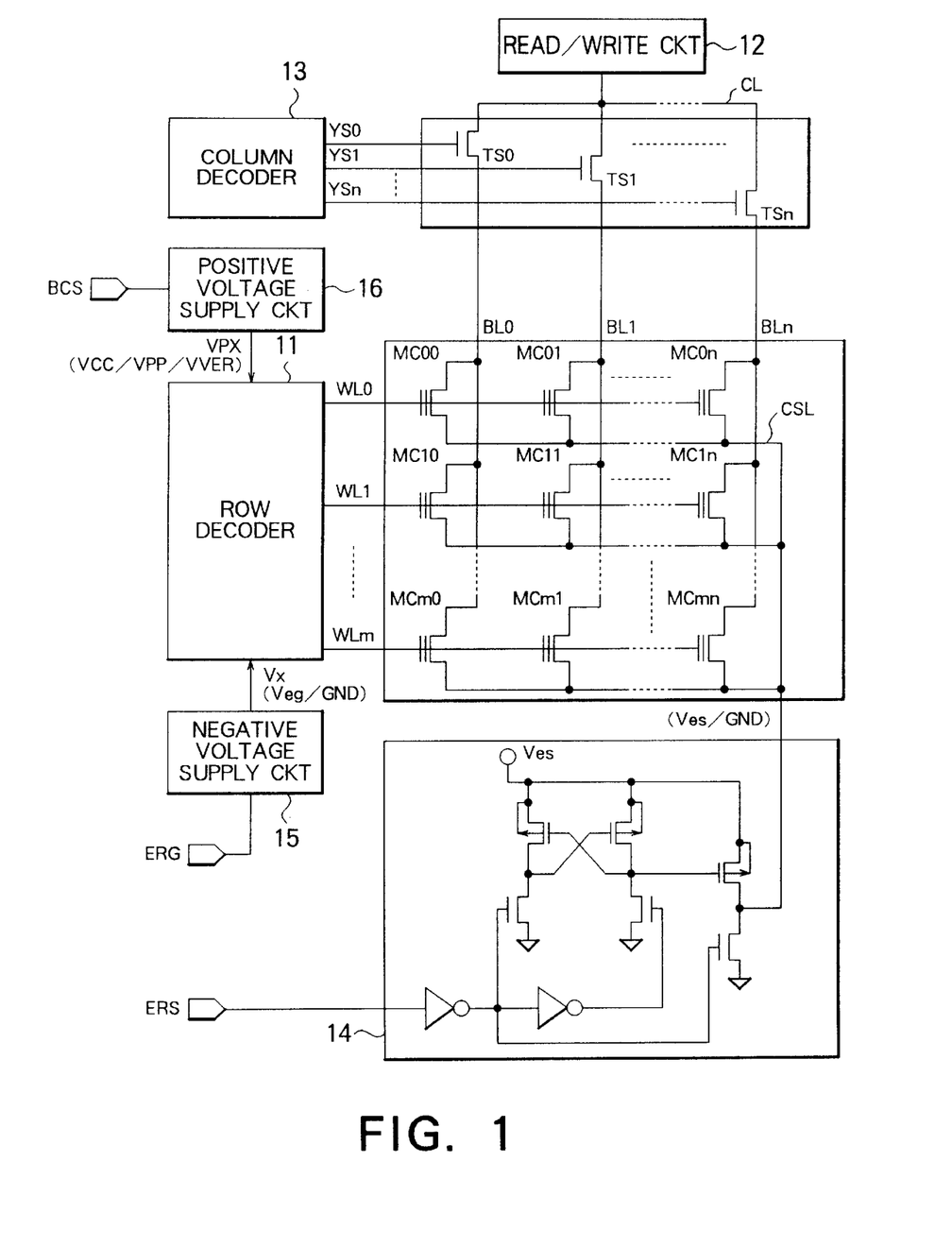
FIG. 1 is a view showing a part of a non-volatile semiconductor memory and a device for erasing a non-volatile semiconductor memory according to a first embodiment of the present invention.

Referring to FIG. 1, a method for erasing a non-volatile semiconductor memory according to a first embodiment of the present invention is described. FIG. 1 shows a part of a semiconductor memory and associated components, as well as an erasing device. The semiconductor memory comprises memory cells MC00 through MCmn. The memory cells MC00 through MCmn are connected to junctions between row lines WL0, WL1, . . . , WLm and column lines BL0, BL1, . . . , BLn, respectively. The row lines WL0 through WLm are connected to a row decoder 11. The column lines BL0 through BLn are connected to a common connection line CL via column selection transistors TS0, TS1, . . . , TSn. The common connection line CL is connected to a read/write circuit 12. Gates of the column selection transistors TS0 through TSn are connected to a column decoder 13 via column selection lines YS0, YS1, . . . , YSn. The above-mentioned components are the semiconductor memory and associated components. The present invention has the feature in that the following components are added to the above.

Sources of the memory cells MC00 through MCmn are all connected to a common source line CSL. The common source line CSL is connected to a source voltage supply circuit 14. The source voltage supply circuit 14 is for applying a positive voltage to the sources of the memory cells MC00 through MCmn or for forcing the sources to have the ground potential or level, via the common source line CSL. The source voltage supply circuit 14 is connected to a supply unit, that is, a control device 30 for an erasing source control signal ERS.

The row decoder 11 is connected to a negative voltage supply circuit 15. The negative voltage supply circuit 15 is connected to a supply unit for an erasing gate control signal ERG. The negative voltage supply circuit 15 is for applying a negative voltage to the gates of the memory cells MC00 through MCmn or for forcing the gate to have the ground potential, via the row decoder 11 and the row lines WL0 through WLm.

The row decoder 11 is also connected to a positive voltage supply circuit 16. The positive voltage supply circuit 16 is connected to a supply unit, that is, a control device for a verify control signal BCS. The positive voltage supply circuit 16 is for applying a positive voltage for the verification of erasing operation to the gates of the memory cells MC00 through MCmn via the row decoder 11 and the row lines WL0 through WLm.

With the above-mentioned configuration, the feature of the first embodiment of the present invention lies in the following two points. First, the entire erasing period for the erasing operation is divided into a first erasing mode and a second erasing mode. In the first erasing mode, the gates of the memory cells MC00 through MCmn are forced to have the ground potential and the positive voltage is applied to the sources to perform the erasing operation until it reaches an erasing voltage VTM2 that is higher than a final erasing voltage VTM1. On the other hand, in the second erasing mode, the negative and the positive voltages are applied to the gates and the sources, respectively, to carry out the erasing operation until the final erasing voltage VTM1 is obtained. This is done to reduce the electrical field between the source and the floating gate by means of optimizing the applied voltages to the sources and the gates.

Second, the first and the second erasing modes are divided into two or more erasing unit intervals. The erasing and erasing verify operations are alternatively carried out by the erasing unit intervals. The erasing verify operation in the first erasing mode may be performed on at least one memory cell. In the second erasing mode, the erasing verify operation is performed for all memory cells. This is for reducing the erasing time duration.

Figure 2:
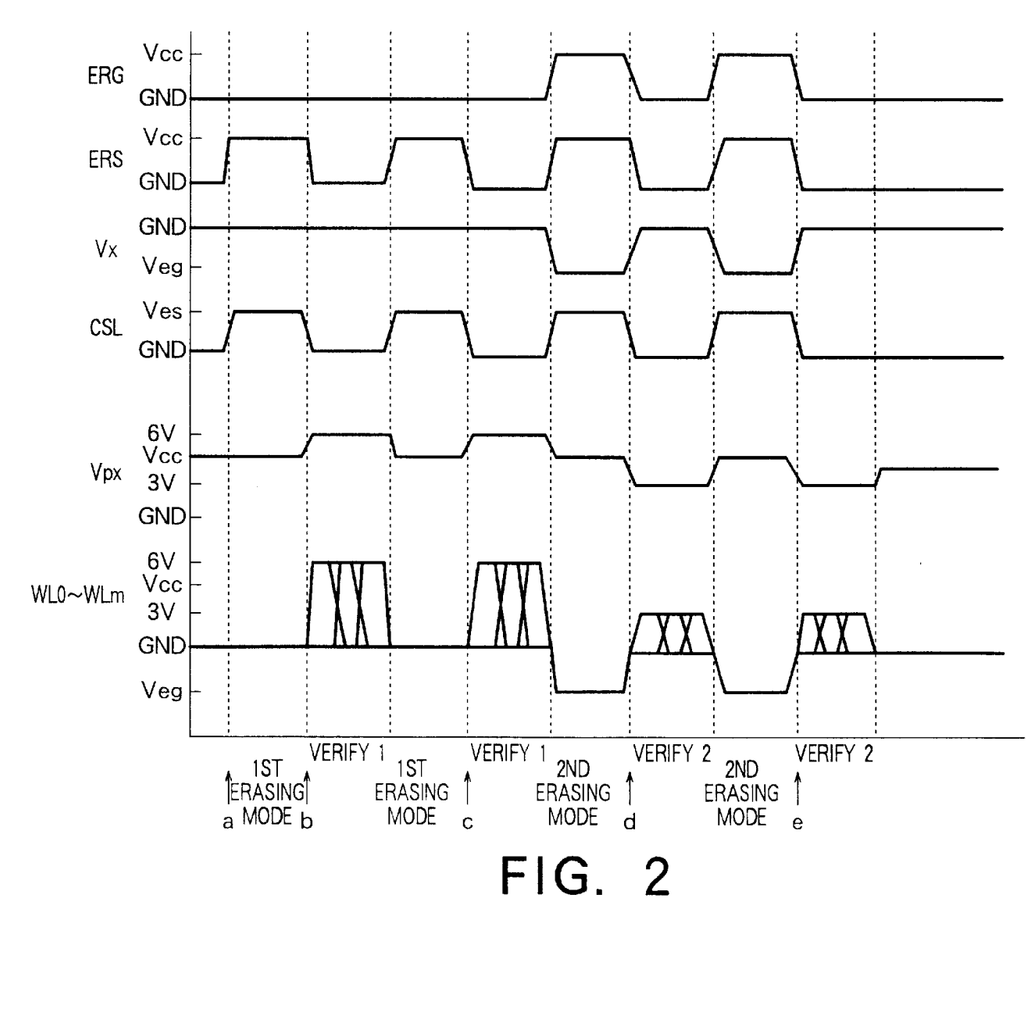
FIG. 2 is a view illustrating waveforms of signals obtained at various points in the erasing device in FIG. 1.

Referring to FIG. 2 along with FIG. 1, the erasing operation is described. In the following example, a final erasing voltage VTM1 is 3 V and an erasing voltage VTM2 for determining erasing in the first erasing mode is 6 V that is higher than the final erasing voltage VTM1. At the initiation of the erasing operation, the control device supplies the erasing source control signal ERS as shown in FIG. 2 to the source voltage supply circuit 14. In response to this, the source voltage supply circuit 14 applies intermittently a source voltage Ves to the sources of the memory cells via the common source line CSL in the first erasing mode. The control device supplies the verify control signal BCS to the positive voltage supply circuit 16 to generate a voltage for erasing verify to be HIGH when the source voltage Ves is LOW. In response to this, the positive voltage supply circuit 16 applies a positive voltage VPX (=6 V) for the erasing verify as shown in FIG. 2 to the gates of the memory cells via the row decoder 11. In this way, in the first erasing mode, the first erasing operation is carried out during the first erasing unit interval. Then, the first erasing verify operation is carried out after the completion of the first erasing operation. During the erasing verify operation, it is determined whether all memory cells are turned on. Subsequently, the above-mentioned erasing operation and the erasing verify operation are alternatively repeated until the erasing voltage becomes VTM2, that is, 6 V. The first erasing mode is completed when it is determined that the erasing voltage reaches 6 V in the second erasing operation.

The first erasing mode leads to the second erasing mode. In the second erasing mode, the control device supplies the erasing gate control signal ERG as shown in FIG. 2 to the negative voltage supply circuit 15. The erasing gate control signal ERG is in synchronism with the erasing source control signal ERS. Therefore, the negative voltage supply circuit 15 applies a negative voltage VX as shown in FIG. 2 to the gates of the memory cells via the row decoder 11. The negative and the positive voltages are supplied to the gates and the sources, respectively, of the memory cells to perform a so-called source-gate erasing operation. In the second erasing mode, the control device supplies the verify control signal BCS to the positive voltage supply circuit 16 to indicate producing the final erasing voltage VTM1 of 3 V. When the erasing operation for the first erasing unit interval is completed in the second erasing mode, then the first erasing verify operation is carried out. The erasing verify operation determines whether all memory cells are turned on. The above-mentioned erasing operation and the erasing verify operations are alternatively repeated, until the erasing voltage becomes VTM1, i.e., 3 V. In FIG. 2, the erasing is completed by the erasing operation during the second erasing unit interval.

Figure 3:
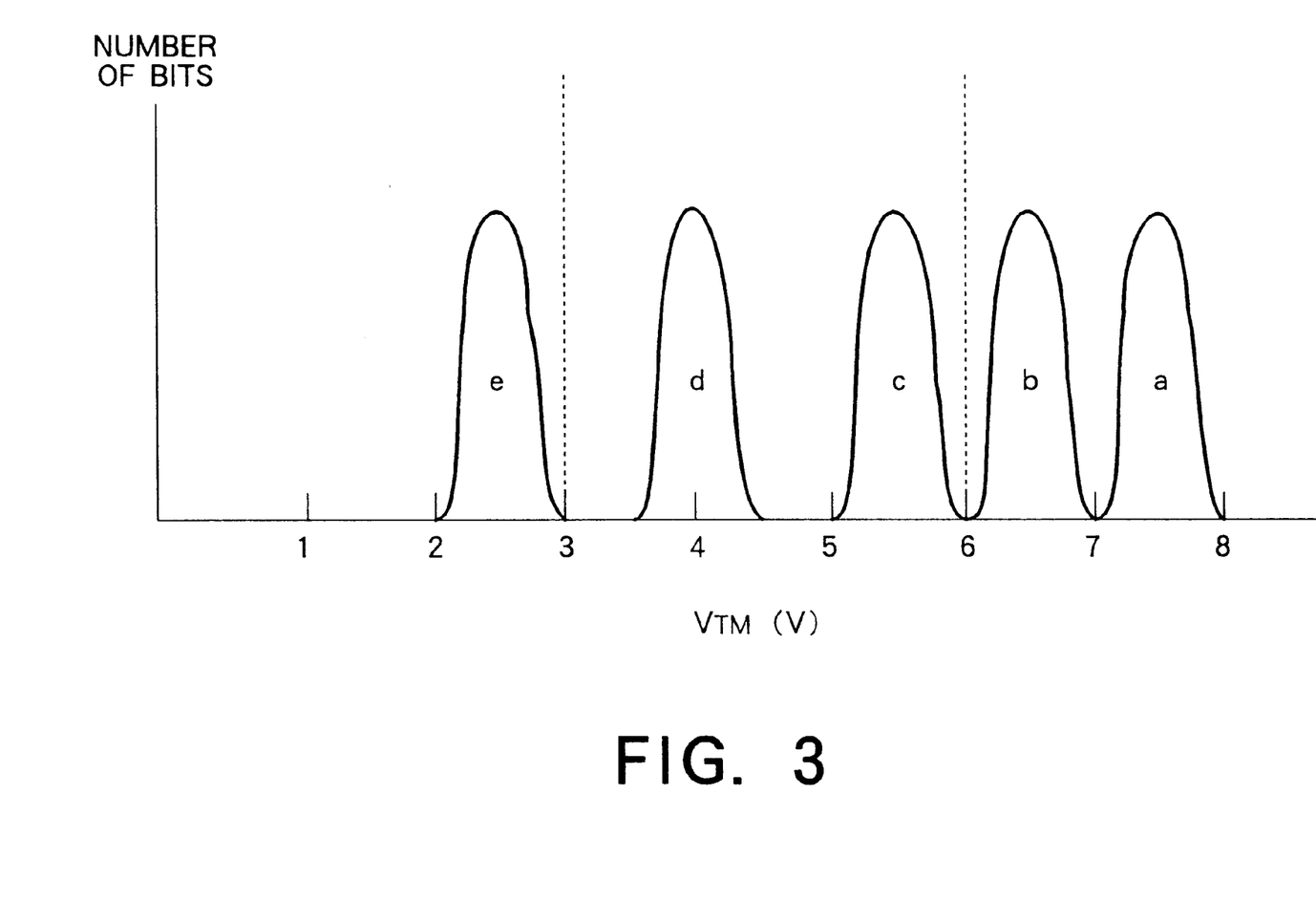
FIG. 3 is a view illustrating distribution of threshold values for an erasing voltage across the memory cells obtained when erasing operation is carried out by signals shown in FIG. 2.

FIG. 3 shows distribution of threshold values (VTM) for the memory cells when the erasing operation is carried out in the above-mentioned manner. In FIG. 3, symbols a through d indicate distributions at the timing shown in FIG. 2 with the same symbols. This means that the turning on of a predetermined number of more of the memory cells can be determined as the information to complete the first and the second erasing modes, without determining whether the all memory cells are turned on by using the erasing verification operation in the first and the second erasing modes. This is advantageous to reduce the time duration for the erasing operation. Furthermore, it is preferable that the turning on of at least one memory cell is determined as the information to terminate the first erasing mode. Such the erasing verify operation may be made by means of selecting at least one combination of the column line and the row line to select at least one memory cell, applying to the gate of the selected at least one memory cell a verify voltage that is equal to the erasing voltage VTM2, and determining whether the selected memory cell is turned on. This is the above-mentioned second feature.

Figure 4:
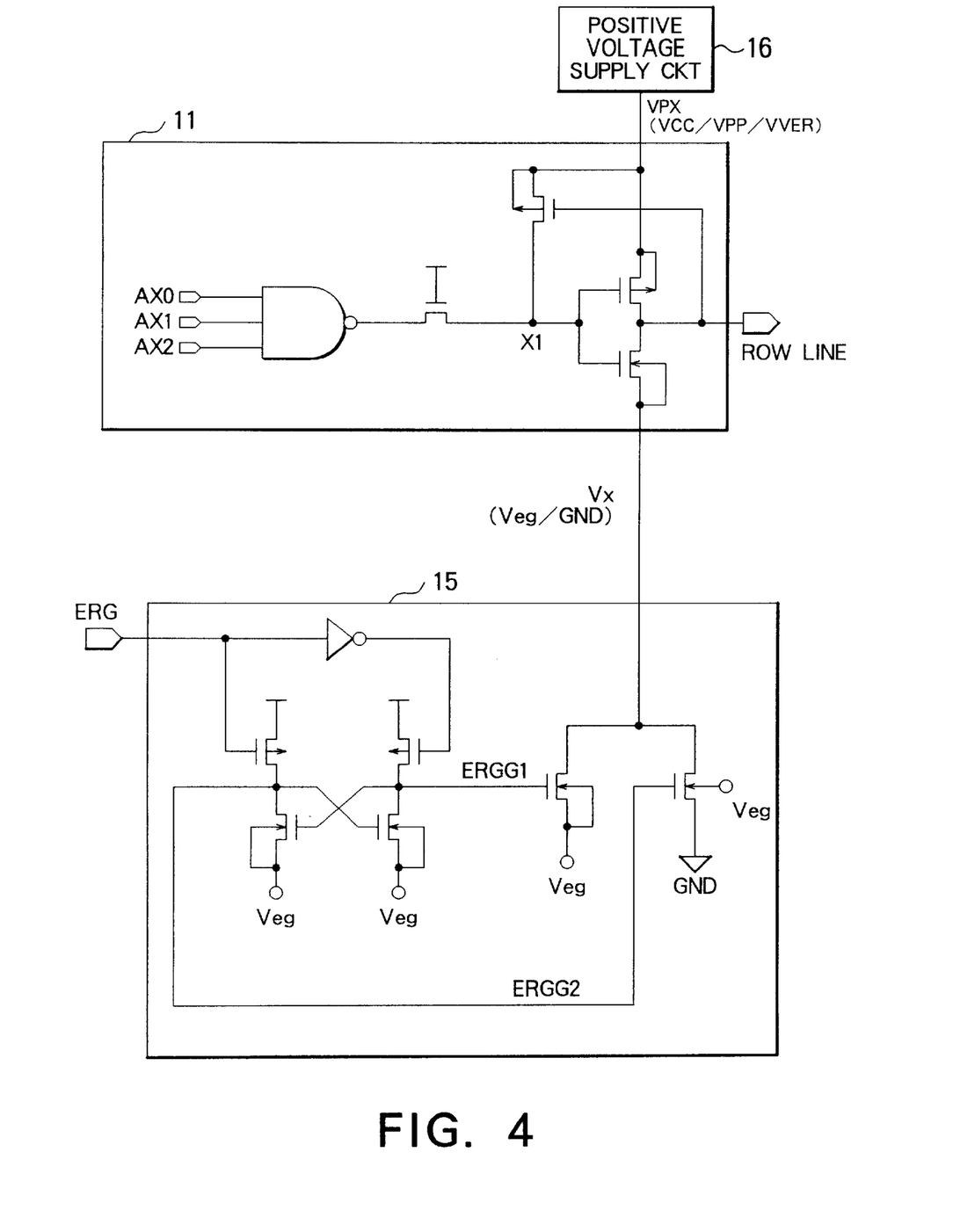
FIG. 4 is a circuit diagram showing exemplified row line decoder and negative voltage supply circuit in FIG. 1.
Figure 5:
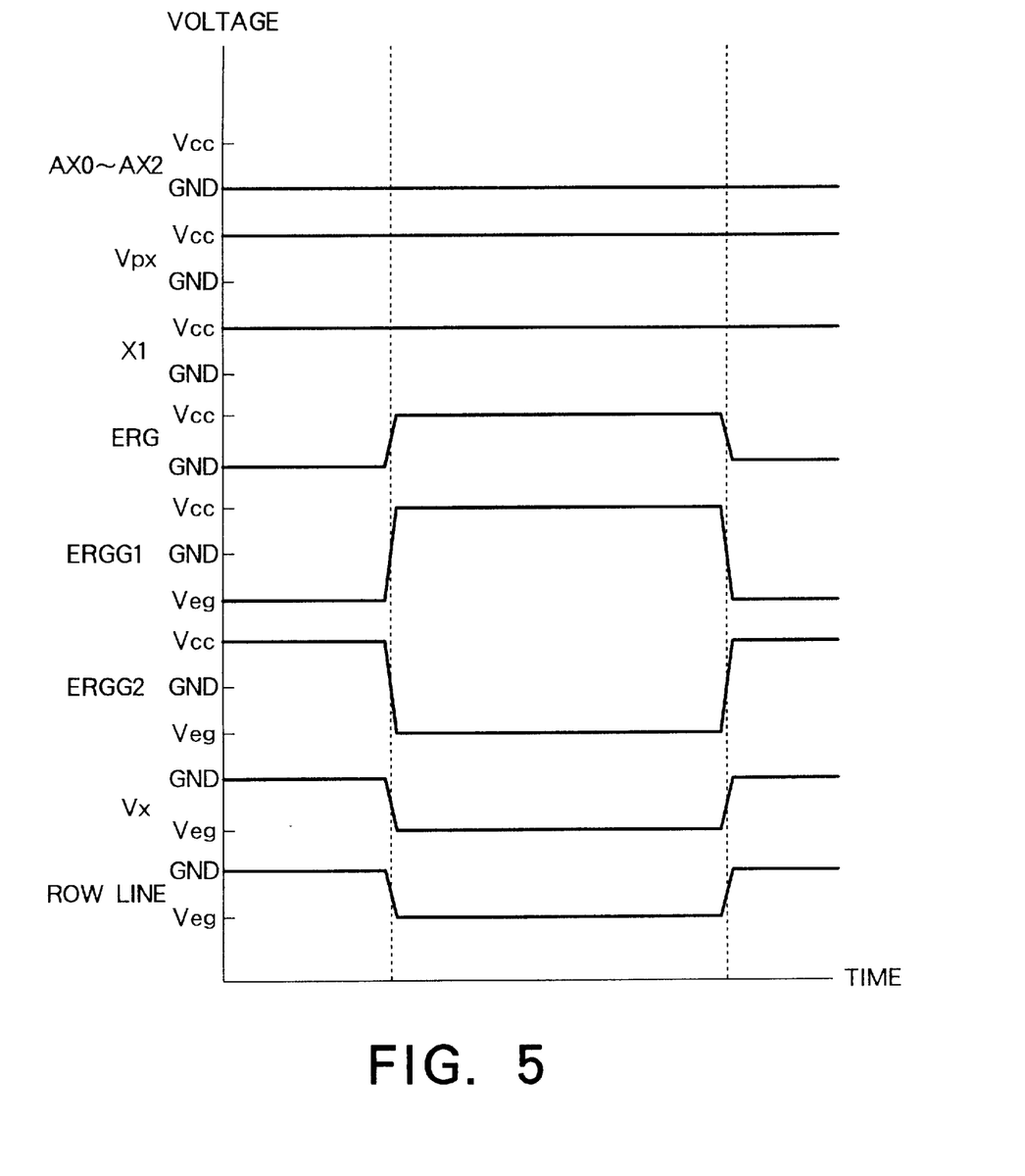
FIG. 5 is a view illustrating waveforms of signals obtained at various points in the circuit in FIG. 4.

Just for a reference, FIG. 4 illustrates the row decoder 11 per one row line and an exemplified negative voltage supply circuit 15. FIG. 5 shows signal waveforms obtained at various points in FIG. 4, which is not a subject of the present invention. Briefly, the negative voltage supply circuit 15 applies the negative voltage VX having the voltage value of Veg to the row lines via the row decoder 11 when the erasing gate control signal ERG becomes HIGH.

Figure 6:
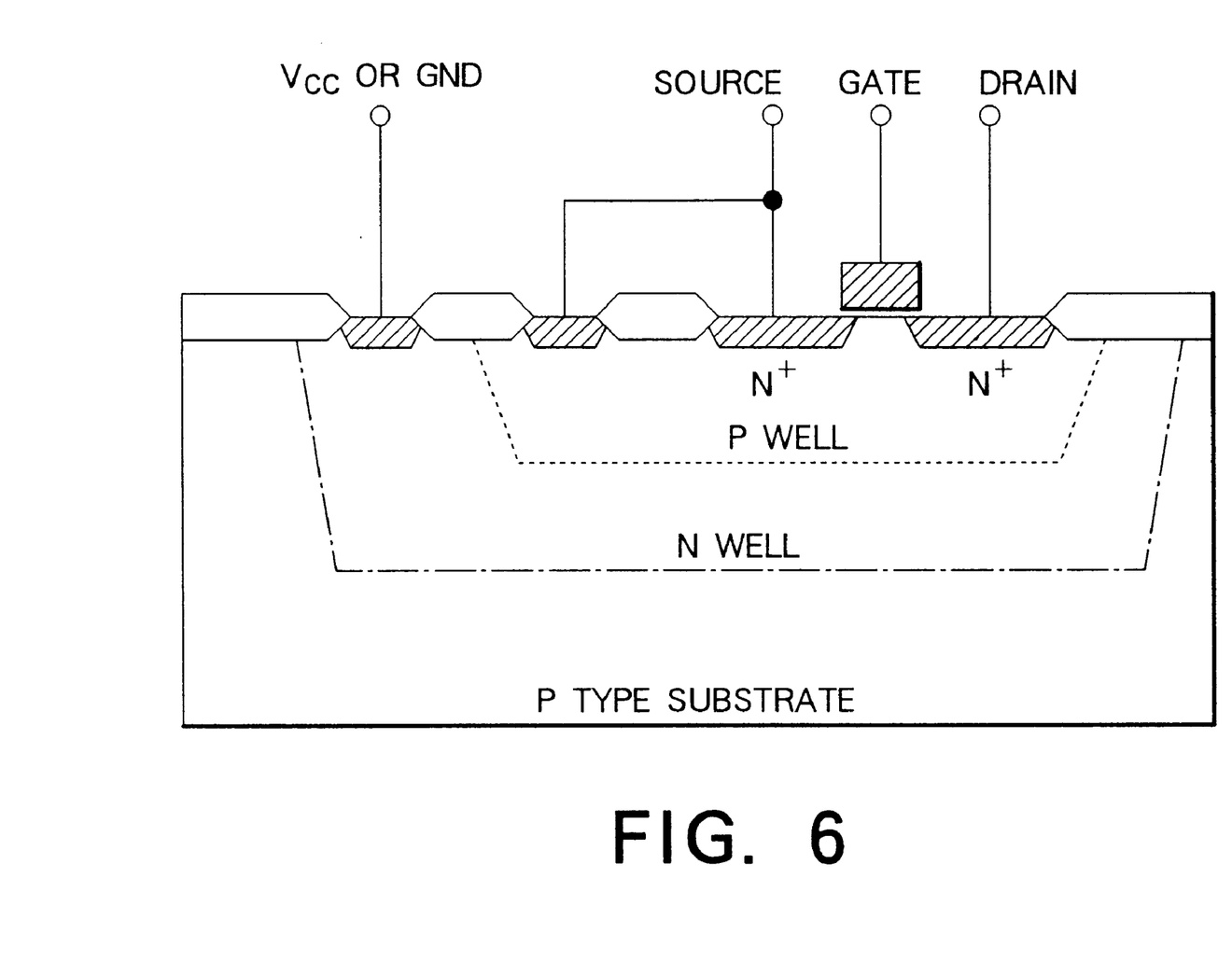
FIG. 6 is a sectional view showing an exemplified N-type transistor used in the circuit in FIG. 4.

FIG. 6 shows an exemplified N-type transistor to which the negative voltage is applied, that is used in the circuit in FIG. 4. This transistor has an N-type transistor formed in a P well separated by an N well on a P-type substrate. Furthermore, the negative voltage is applied to the P well as a substrate bias to allow supply of the negative voltage to the N-type transistor.

The positive voltage supply circuit 16 produces several verify voltages in response to the verify control signal BCS. Such a circuit is disclosed in, for example, U.S. Pat. No. 4,875,188, of which description is omitted because it is not a subject of the present invention.

Figure 7:
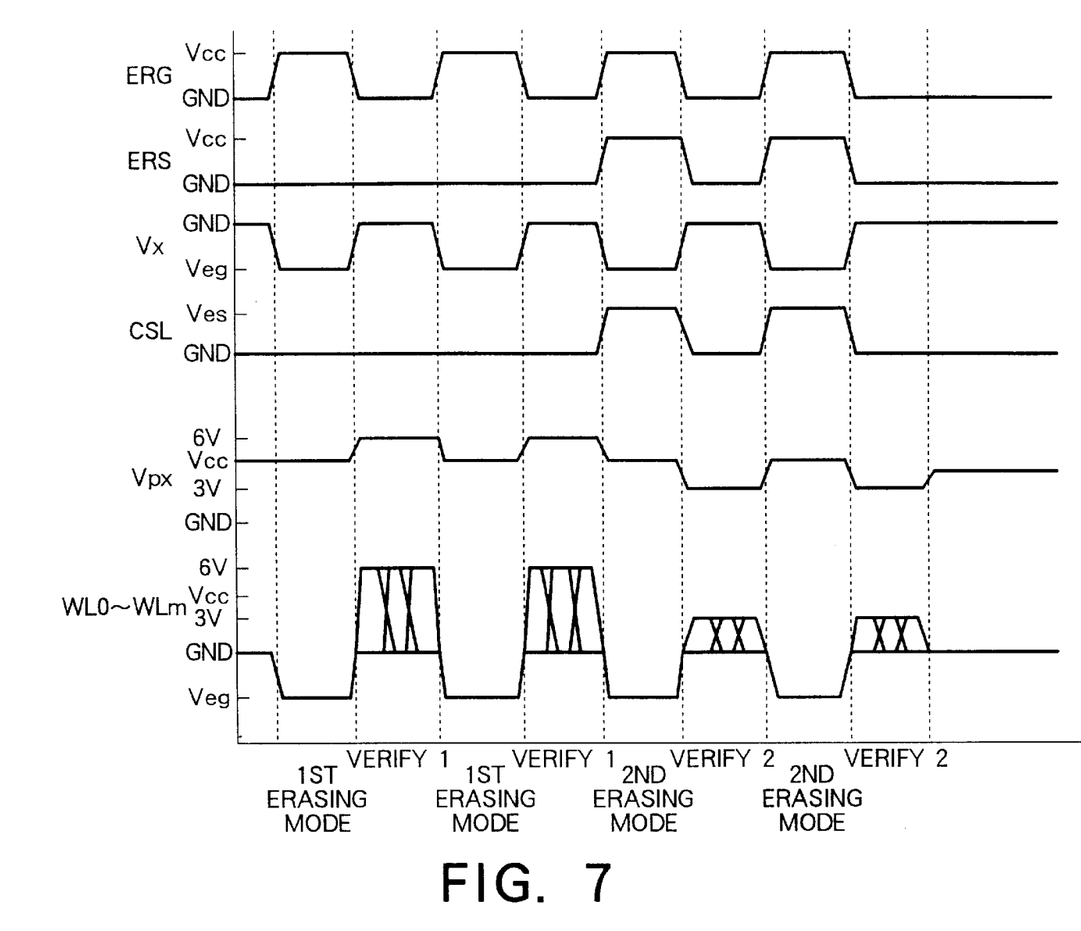
FIG. 7 is a view illustrating waveforms of signals obtained at various points in the erasing device in FIG. 1, for use in describing an erasing method according to a second embodiment of the present invention.

Referring to FIG. 7, a method for erasing a non-volatile semiconductor memory according to a second embodiment of the present invention is described. This erasing method is carried out by the erasing device illustrated in FIG. 1. In this erasing method, the negative voltage is applied to the gates of the memory cells and the sources having the ground potential in the first erasing mode. In the second erasing mode, the erasing is performed with the negative and the positive voltages being applied to the gates and the sources, respectively, of the memory cells as in the erasing method according to the first embodiment. In this example, the final erasing voltage VTM1 is 3 V, and the erasing voltage VTM2 for determining erasing in the first erasing mode is 6 V.

At the initiation of the erasing operation, the control device supplies, in the first erasing mode, the erasing gate control signal EGS as shown in FIG. 7 to the negative voltage supply circuit 15. In response to this, the negative voltage supply circuit 15 applies intermittently a negative gate voltage VX to the gates of the memory cells via the row decoder 11. On the other hand, the erasing source control signal ERS is kept LOW that is supplied to the source voltage supply circuit 14. In this state, the source voltage supply circuit 14 forces the sources of the memory cells to have the ground potential. The control device supplies the verify control signal BCS to the positive voltage supply circuit 16 to generate a voltage for erasing verify to be HIGH when the gate voltage VX is LOW. In response to this, the positive voltage supply circuit 16 applies a positive voltage VPX (=6 V) for the erasing verify as shown in FIG. 7 to the gates of the memory cells via the row decoder 11. In this way, in the first erasing mode, the first erasing operation is carried out during the first erasing unit interval. Then, the first erasing verify operation is carried out after the completion of the first erasing operation. During the erasing verify operation, it is determined whether all memory cells are turned on. Subsequently, the above-mentioned erasing operation and the erasing verify operation are alternatively repeated until the erasing voltage becomes VTM2, that is, 6 V. The first erasing mode is terminated when it is determined that the erasing voltage reaches 6 V in the second erasing operation.

In the second embodiment, it is preferable that the first erasing mode is terminated when at least one memory cell is turned on in the first erasing mode.

The first erasing mode leads to the second era sing mode. In the second erasing mode, the control device supplies the erasing gate control signal ERG as shown in FIG. 7 to the negative voltage supply circuit 15. On the other hand, the control device supplies the erasing source control signal ERS as shown in FIG. 7 to the source voltage supply circuit 14. In response to this, the source voltage supply circuit 14 applies intermittently a source voltage Ves to the sources of the memory cells via the common source line CSL. The erasing source control signal ERS is in synchronism with the erasing gate control signal ERG. Therefore, the negative voltage supply circuit 15 applies a negative voltage VX as shown in FIG. 7 to the gates of the memory cells via the row decoder 11. The source voltage supply circuit 14 applies the positive voltages to the sources of the memory cells to provide the source-gate erasing operation. In the second erasing mode, the control device supplies the verify control signal BCS to the positive voltage supply circuit 16 to indicate producing the final erasing voltage VTM b of 3 V. When the erasing operation for the first erasing unit interval is completed in the second erasing mode, then the first erasing verify operation is carried out. The erasing verify operation determines whether all memory cells are turned on. The above-mentioned erasing operation and the erasing verify operations are alternatively repeated, until the erasing voltage becomes VTM1, i.e., 3 V. In FIG. 7, the erasing is completed by the erasing operation during the second erasing unit interval.

In the erasing methods of the first and the second embodiments, the negative voltage applied to the gates of the memory cell is constant. However, in the second erasing mode in particular, a step-shaped negative voltage may be applied to the gates which is decreased stepwise. This is advantageous in view of reducing the erasing time duration.

As described above, the present invention divides the entire erasing period for erasing into the first and the second erasing modes. in the first erasing mode, the gates of the memory cells have the ground potential or a negative potential, while a positive voltage is applied to the sources to perform the erasing operation until it reaches an erasing voltage VTM2 that is higher than a final erasing voltage VTM1. On the other hand, in the second erasing mode, the negative and the positive voltages are applied to the gates and the sources, respectively, to perform the erasing operation until the final erasing voltage VTM1 is obtained. This allows reduction of the electrical field between the source and the floating gate by means of optimizing the applied voltages to the sources and the gates. Accordingly, deterioration of the lifetime characteristics can be avoided.

In addition, the first and the second erasing modes are divided into two or more erasing unit intervals. The erasing and the erasing verify operations are alternatively carried out by the erasing unit intervals. The erasing verify operation in the first erasing mode may be performed on at least one memory cell. In the second erasing mode, the erasing verify operation is performed for all memory cells. This is for reducing the erasing time duration.

What is claimed is:

1. A method for erasing a non-volatile semiconductor memory having a plurality of memory cells, comprising the steps of:

dividing an entire erasing period for the non-volatile semiconductor memory into a first erasing mode and a second erasing mode;

applying, in the first erasing mode, a positive voltage to sources of the memory cells with gates of the memory cells at a ground potential to carry out the erasing operation; and applying, in the second erasing mode, negative and positive voltages to the gates and the sources, respectively, of the memory cells to carry out the erasing operation.

2. A method for erasing a non-volatile semiconductor memory having a plurality of memory cells, comprising the steps of:

dividing an entire erasing period for the non-volatile semiconductor memory into a first erasing mode and a second erasing mode;

applying, in the first erasing mode, a positive voltage to sources of the memory cells with gates of the cells at a ground potential to carry out the operation; and applying, in the second erasing mode, negative and positive voltages to the gates and the sources, respectively, of the memory cells to carry out the erasing operation, wherein the first erasing mode is carried out until said positive voltage reaches an erasing voltage VTM2 and the second erasing mode is carried out until said positive voltage reaches a final erasing voltage VTM1, wherein VTM2 is higher than VTM1.

3. A method for erasing a non-volatile semiconductor memory as claimed in claim 2, wherein first and the second erasing modes are divided into an erasing operation and an erasing verify operation alternatively carried out.

4. A method for erasing a non-volatile semiconductor memory as claimed in claim 3, wherein the erasing verify operation in the first erasing mode is performed on at least one memory cell, and the erasing verify operation in the second erasing mode is performed for all memory cells.

5. A method for erasing a non-volatile semiconductor memory as claimed in claim 4, wherein the erasing verify operation that is carried out on at least one memory cell in the first erasing mode comprises the steps of selecting at least one combination of a column line and a row line to select at least one memory cell, applying to the gate of the selected at least one memory cell a verify voltage that is equal in magnitude to the erasing voltage VTM2, and determining whether the selected memory cell is turned on.

6. A method for erasing a non-volatile semiconductor memory as claimed in any one of claim 1 wherein the negative voltage applied to the gates in the second erasing mode is a step-shaped voltage that is gradually decreased.

7. A method for erasing a non-volatile semiconductor memory having a plurality of memory cells, comprising the steps of:

dividing an entire erasing period for the non-volatile semiconductor memory into a first erasing mode and a second erasing mode;

applying, in the first erasing mode, a negative voltage to gates of the memory cells with sources of the memory cells at a ground potential to carry out the erasing operation; and applying, in the second erasing mode, negative and positive voltages to the gates and the sources, respectively, of the memory cells to carry out the erasing operation.

8. A method for erasing a non-volatile semiconductor memory having a plurality of memory cells, comprising the steps of:

dividing an entire erasing period for the non-volatile semiconductor memory into a first erasing mode and a second erasing mode;

applying, in the first erasing mode, a negative voltage to gates of the memory cells with sources of the memory cells at a ground potential to carry out the erasing operation; and applying, in the second erasing mode, negative and positive voltages to the gates and the sources, respectively, of the memory cells to carry out the erasing operation, wherein the first erasing mode is carried out until said positive voltage reaches an erasing voltage VTM2 and the second erasing mode is carried out until said positive voltage reaches a final erasing voltage VTM1, wherein VTM2 is higher than VTM1.

9. A method for erasing a non-volatile semiconductor memory as claimed in claim 8, wherein first and the second erasing modes are divided into an erasing operation and an erasing verify operation alternatively carried out.

10. A method for erasing a non-volatile semiconductor memory as claimed in claim 9, wherein the erasing verify operation in the first erasing mode is performed on at least one memory cell, and the erasing verify operation in the second erasing mode is performed for all memory cells.

11. A method for erasing a non-volatile semiconductor memory as claimed in claim 10, wherein the erasing verify operation that is carried out on at least one memory cell in the first erasing mode comprises the steps of selecting at least one combination of a column line and a row line to select at least one memory cell, applying to the gate of the selected at least one memory cell a verify voltage that is equal in magnitude to the erasing voltage VTM2, and determining whether the selected memory cell is turned on.

12. A method for erasing a non-volatile semiconductor memory as claimed in any one of claim 7, wherein the negative voltage applied to the gates in the second erasing mode is a step-shaped voltage that is gradually decreased.

13. A device for erasing a non-volatile semiconductor memory having a plurality of memory cells, comprising:

a negative voltage supply circuit for applying a negative voltage to gates of the memory cells via a row decoder in response to an erasing gate control signal;

a source voltage supply circuit for applying a positive voltage to sources of the memory cells via a common source line in response to an erasing source control signal;

a positive voltage supply circuit for applying a positive voltage for verification to the gates of the memory cells via the row decoder; and a control device adapted to generate the erasing gate control signal, the erasing source control signal, and a signal for the verify control at a predetermined timing, said control device dividing the entire erasing period for the non-volatile semiconductor memory into a first erasing mode and a second erasing mode, said control device generating, in the first erasing mode, the erasing gate control signal to force the gates of the memory cells to have the ground potential and the erasing source control signal to apply the positive voltage to the sources of the memory cells to carry out the control for the erasing operation, and said control device then generating, in the second erasing mode, the erasing gate control signal to apply the negative voltage to the gates of the memory cells and the erasing source control signal to apply the positive voltage to the sources of the memory cells to carry out the control for the erasing operation.

14. A device for erasing a non-volatile semiconductor memory having a plurality of memory cells, comprising:

a negative voltage supply circuit for applying a negative voltage to gates of the memory cells via a row decoder in response to an erasing gate control signal;

a source voltage supply circuit for applying a positive voltage to sources of the memory cells via a common source line in response to an erasing source control signal;

a positive voltage supply circuit for applying a positive voltage for verification to the gates of the memory cells via the row decoder; and a control device adapted to generate the erasing gate control signal, the erasing source control signal, and a signal for the verify control at a predetermined timing, said control device dividing the entire erasing period for the non-volatile semiconductor memory into a first erasing mode and a second erasing mode, said control device generating, in the first erasing mode, the erasing gate control signal to force the gates of the memory cells to have the ground potential and the erasing source control signal to apply the positive voltage to the sources of the memory cells to carry out the control for the erasing operation, and said control device then generating, in the second erasing mode, the erasing gate control signal to apply the negative voltage to the gates of the memory cells and the erasing source control signal to apply the positive voltage to the sources of the memory cells to carry out tile control for the erasing operation, wherein said control device performs the first erasing mode until said positive voltage reaches an erasing voltage VTM2 and performs the second erasing mode until said positive voltage reaches a final erasing voltage VTM1, wherein VTM2 is higher than VTM1.

15. A device for erasing a non-volatile semiconductor memory as claimed in claim 14, wherein said control device divides the first and the second erasing modes into a plurality of erasing unit intervals and generates the erasing gate control signal, the erasing source control signal, and the signal for the verify control for ensuring that the erasing and erasing verify operations are alternatively carried out by the erasing unit intervals.

16. A device for erasing a non-volatile semiconductor memory as claimed in claim 15, wherein said control device supplies, in the erasing verify operation in the first erasing mode, a selection control signal to the row decoder to select at least one memory cell, and supplies, in the erasing verify operation in the second erasing mode, said selection control signal to the row decoder to select all memory cells.

17. A device for erasing a non-volatile semiconductor memory as claimed in claim 16, wherein the erasing verify operation that is carried out on at least one memory cell in the first erasing mode comprises the steps of selecting at least one combination of a column line and a row line to select at least one memory cell as a selected memory cell, applying to the gate of the selected memory cell a verify voltage that is equal in magnitude to the erasing voltage VTM2, and determining whether the selected memory cell is turned on.

18. A device for erasing a non-volatile semiconductor memory as claimed in any one of said claim 13, wherein said control device supplies to said negative voltage supply circuit to the erasing gate control signal to decrease stepwise the negative voltage applied to the gates in the second erasing modes.

19. A device for erasing a non-volatile semiconductor memory having a plurality of memory cells, comprising:

a negative voltage supply circuit for applying a negative voltage to gates of the memory cells via a row decoder in response to an erasing gate control signal;

a source voltage supply circuit for applying a positive voltage to sources of the memory cells via a common source line in response to an erasing source control signal;

a positive voltage supply circuit for applying a positive voltage for verification to the gates of the memory cells via the row decoder; and a control device adapted to generate the erasing gate control signal, the erasing source control signal, and a signal for the verify control at a predetermined timing, said control device dividing the entire erasing period for the non-volatile semiconductor memory into a first erasing mode and a second erasing mode, said control device generating, in the first erasing mode, the erasing gate control signal to apply the positive voltage to the gates and the erasing source control signal to force the sources to have the ground potential to carry out the control for the erasing operation, and said control device then generating, in the second erasing mode, the erasing gate control signal to apply the negative voltage to the gates and the erasing source control signal to apply the positive voltage to the sources to carry out the control for the erasing operation.

20. A device for erasing a non-volatile semiconductor memory having a plurality of memory cells, comprising a negative voltage supply circuit for applying a negative voltage to gates of the memory cells via a row decoder in response to an erasing gate control signal;

a source voltage supply circuit for applying a positive voltage to sources of the memory cells via a common source line in response to an erasing source control signal;

a positive voltage supply circuit for applying a positive voltage for verification to the gates of the memory cells via the row decoder; and a control device adapted to generate the erasing gate control signal, the erasing source control signal, and a signal for the verify control at a predetermined timing, said control device dividing the entire erasing period for the non-volatile semiconductor memory into a first erasing mode and a second erasing mode, said control device generating, in the first erasing mode, the erasing gate control signal to apply the positive voltage to the gates and the erasing source control signal to force the sources to have the ground potential to carry out the control for the erasing operation, and said control device then generating, in the second erasing mode, the erasing gate control signal to apply the negative voltage to the gates and the erasing source control signal to apply the positive voltage to the sources to carry out the control for the erasing operation, wherein said control device performs the first erasing mode until said positive voltage reaches an erasing voltage VTM2 and performs the second erasing mode until said positive voltage reaches a final erasing voltage VTM1, wherein VTM2 is higher than VTM1.

21. A device for erasing a non-volatile semiconductor memory as claimed in claim 20, wherein said control device divides the first and the second erasing modes into a plurality of erasing unit intervals and generates the erasing gate control signal, the erasing source control signal, and the signal for the verify control for ensuring that the erasing and erasing verify operations are alternatively carried out by the erasing unit intervals.

22. A device for erasing a non-volatile semiconductor memory as claimed in claim 21, wherein said control device supplies, in the erasing verify operation in the first erasing mode, a selection control signal to the row decoder to select at least one memory cell, and supplies, in the erasing verify operation in the second mode, said selection control signal to the row decoder to select all memory cells.

23. A device for erasing a non-volatile semiconductor memory as claimed in claim 22, wherein the erasing verify operation that is carried out on at least one memory cell in the first erasing mode comprises the steps of selecting at least one combination of a column line and a row line to select at least one memory cell as a selected memory, applying to the gate of the selected memory cell a verify voltage that is equal in magnitude to the erasing voltage VTM2, and determining whether the selected memory cell is turned on.

24. A device for erasing a non-volatile semiconductor memory as claimed in any one of claim 19, wherein said control device supplies to said negative voltage supply circuit to the erasing gate control signal to decrease stepwise the negative voltage applied to the gates in the second erasing modes.

* * * * *